United States Patent
Kim et al.

(10) Patent No.: US 10,409,162 B2
(45) Date of Patent: Sep. 10, 2019

(54) HIGHLY HEAT RESISTANT POLYSILSESQUIOXANE-BASED PHOTOSENSITIVE RESIN COMPOSITION

(71) Applicant: LTC CO., LTD, Gyeonggi-do (KR)

(72) Inventors: Jun Young Kim, Gyeonggi-do (KR); Hwa Young Kim, Gyeonggi-do (KR); Sang Hun Cho, Gyeonggi-do (KR); Kwang Hyun Ryu, Gyeonggi-do (KR); Ho Sung Choi, Gyeonggi-do (KR)

(73) Assignee: LTC CO., LTD. (KR)

( * ) Notice: Subject to any disclaimer, the term of this patent is extended or adjusted under 35 U.S.C. 154(b) by 0 days.

(21) Appl. No.: 15/039,740

(22) PCT Filed: Aug. 28, 2015

(86) PCT No.: PCT/KR2015/009030
§ 371 (c)(1),
(2) Date: May 26, 2016

(87) PCT Pub. No.: WO2016/032269
PCT Pub. Date: Mar. 3, 2016

(65) Prior Publication Data
US 2017/0166700 A1 Jun. 15, 2017

(30) Foreign Application Priority Data

Aug. 28, 2014 (KR) ........................ 10-2014-0113197

(51) Int. Cl.
| | | |
|---|---|---|
| *G03F 7/023* | (2006.01) | |
| *G03F 7/075* | (2006.01) | |
| *C08G 77/04* | (2006.01) | |
| *G03F 7/004* | (2006.01) | |
| *G03F 7/039* | (2006.01) | |
| *G03F 7/16* | (2006.01) | |
| *G03F 7/20* | (2006.01) | |
| *G03F 7/32* | (2006.01) | |
| *H01L 27/32* | (2006.01) | |
| *G03F 7/038* | (2006.01) | |
| *G02F 1/1333* | (2006.01) | |
| *G02F 1/1362* | (2006.01) | |
| *C08G 77/14* | (2006.01) | |
| *C08G 77/18* | (2006.01) | |

(52) U.S. Cl.
CPC .......... *G03F 7/0233* (2013.01); *C08G 77/04* (2013.01); *G03F 7/0045* (2013.01); *G03F 7/038* (2013.01); *G03F 7/039* (2013.01); *G03F 7/0757* (2013.01); *G03F 7/162* (2013.01); *G03F 7/168* (2013.01); *G03F 7/2002* (2013.01); *G03F 7/322* (2013.01); *H01L 27/3246* (2013.01); *H01L 27/3258* (2013.01); *C08G 77/14* (2013.01); *C08G 77/18* (2013.01); *G02F 1/133345* (2013.01); *G02F 1/136227* (2013.01); *G02F 2001/133357* (2013.01); *G02F 2202/02* (2013.01); *H01L 2227/323* (2013.01)

(58) Field of Classification Search
CPC ............................. G03F 7/0233; G03F 7/0757
USPC ................................. 430/191, 192, 193, 326
See application file for complete search history.

(56) References Cited

U.S. PATENT DOCUMENTS

| | | | | |
|---|---|---|---|---|
| 8,524,441 B2 * | 9/2013 | Zhang | .................. | C08G 77/045 430/272.1 |
| 8,524,851 B2 * | 9/2013 | Kim | .................... | C08G 77/50 430/311 |
| 2010/0279509 A1 * | 11/2010 | Kim | .................... | C08G 77/50 438/706 |
| 2014/0322651 A1 * | 10/2014 | Wu | .................... | G03F 7/0757 430/281.1 |
| 2015/0031808 A1 * | 1/2015 | Huang | .................. | G03F 7/0757 524/159 |
| 2015/0050596 A1 * | 2/2015 | Wu | .................... | G03F 7/0005 430/287.1 |

FOREIGN PATENT DOCUMENTS

| | | |
|---|---|---|
| JP | 2007-193318 A | 8/2007 |
| JP | 2008-298880 A | 12/2008 |
| KR | 10-2007-0032392 A | 3/2007 |
| KR | 10-2014-0047052 A | 4/2014 |
| KR | 10-1401419 B1 | 5/2014 |

OTHER PUBLICATIONS

International Search Report prepared by the Korean Intellectual Property Office dated Dec. 21, 2015, for International Application No. PCT/KR2015/009030.
Decision of Grant with English Translation for Korea Patent Application No. 10-2014-0113197, dated May 1, 2015, 7 pages.

* cited by examiner

*Primary Examiner* — John S Chu
(74) *Attorney, Agent, or Firm* — Sheridan Ross P.C.

(57) ABSTRACT

The present invention relates to a highly heat resistant silsesquioxane-based photosensitive resin composition for a liquid crystal display device or an organic EL display device, and a positive resist insulating layer prepared therefrom, and in particular, to a silsesquioxane-based photosensitive resin composition having high heat resistance and a low dielectric property, capable of being used as an insulating layer forming a via hole of the thin film transistor (TFT), and simultaneously, capable of being used as an insulating layer for forming a bank pattern dividing pixels of an organic EL display device.

6 Claims, 1 Drawing Sheet

US 10,409,162 B2

HIGHLY HEAT RESISTANT POLYSILSESQUIOXANE-BASED PHOTOSENSITIVE RESIN COMPOSITION

CROSS REFERENCE TO RELATED APPLICATIONS

This application is a national stage application under 35 U.S.C. 371 and claims the benefit of PCT Application No. PCT/KR2015/009030 having an international filing date of Aug. 28, 2015, which designated the United States, which PCT application claimed the benefit of Korean Patent Application No. KR 10-2014-0113197 filed Aug. 28, 2014, the disclosures of each of which are incorporated herein by reference.

TECHNICAL FIELD

The present invention relates to a highly heat resistant positive resist composition. In particular, the present invention relates to a highly heat resistant positive resist composition capable of being simultaneously used as a via hole insulating layer for a liquid crystal display device and an insulating layer for a bank pattern of an organic EL display device.

BACKGROUND ART

With the recent development of technologies allowing liquid crystal display devices or organic EL display devices to have a large area, high luminance and high resolution, demands for high performance materials supporting the devices are growing. Accordingly, device structures of liquid crystal display devices or organic EL display devices have become more complicated. Consequently, high resolution materials capable of forming micropatterns are preferable as an insulating layer used for forming a via hole in an ultrathin film transistor (TFT) for driving signals, and as a bank material for forming pixels of an organic EL display device.

In a manufacturing process of the above-mentioned display devices, a pattern forming process producing the above-mentioned constituents is generally carried out through a photolithography process. In order to form micropatterns through such a photolithography process, a resist composition is generally used.

Such a resist composition may process a via hole or form a bank pattern through a photolithography process, and in order to obtain patterns with high resolution, the composition needs to be readily developed in a thin alkali developing liquid, and needs to form an intermolecular crosslinked bond through a curing process to have chemical resistance, heat resistance and post-process reliability.

Existing positive resists for an insulating layer have normally used materials combining acryl-based binders and naphthoquinonediazide compounds (Japanese Patent Application Laid-Open Publication No. H10-153854) and the like, however, heat resistance thereof is significantly insufficient to withstand a high temperature ITO heat treatment process, and these materials are used only in processes using amorphous ITO.

These materials are not able to be used in low-temperature poly silicone (LTPS) processes that have recently received attention as a back plane for organic EL display devices due to insufficient heat resistance. Meanwhile, materials combining polyimide-based binders and naphthoquinonediazide compounds (PCT/JP2002/01517) have high post-process reliability, and are suitable as a bank forming material for forming pixels of an organic EL display device, but have problems of excessively high raw material costs and a panel price increase caused therefrom, and losing half the solubility declining effect of quinonediazide due to excessively high alkali solubility of a polyamic acid precursor.

In addition, precursor compounds in which a carboxylic acid group is protected by an ester group for compensating high solubility of a polyamic acid precursor have problems in terms of a process in that synthesis steps increase, yields decrease and excessively high exposure is required. Moreover, polyimide-based resins have an aromatic ring as a basic skeleton and the resin itself has dark yellowish brown color, and therefore, the polyimide-based resins have low light transmittance in a visible region, and controlling a pattern residue problem or controlling a development property is not simple due to the excessively rigid skeletal structure.

Accordingly, demands for the development of new positive resist compositions in which heat resistance, a development property for a thin alkali solution, high resolution and high sensitivity properties are all excellent have been ongoing.

DISCLOSURE

Technical Problem

An object of the present invention is to provide a novel polysilsesquioxane-based resist composition having excellent heat resistance at high temperatures, readily forming patterns with high sensitivity and high resolution due to excellent developability for a thin aqueous alkali solution, and having excellent substrate adhesion, flatness, film retention ratio and transmittance.

Another object of the present invention is to provide a positive resist composition capable of being simultaneously used as an insulating layer for forming a via hole of a back plane and a bank insulating layer for forming upper organic EL pixels with one positive resist composition type.

Technical Solution

In one embodiment of the present invention, a positive resist composition of the present invention is prepared using a polysilsesquioxane-based copolymer prepared by copolymerizing two or more types of compounds selected from the group consisting of (a) an organosilane monomer including an "alkali soluble" end; (b) a monomer including "alkali insoluble" various organosilane-based compounds such as hydrogen, alkyl, phenyl, epoxy, methyl and cyclohexyl; and (c) a 6-functional organosilane monomer for molecular weight control through a sol-gel reaction method as a binder resin, and mixing a photo-active compound having a naphthoquinonediazide sulfonic acid ester group-substituted structure thereto.

In addition, in one embodiment of the present invention, a positive resist composition is prepared using a polysilsesquioxane-based copolymer prepared by copolymerizing (a) an organosilane monomer including an "alkali soluble" end; (b) a monomer including "alkali insoluble" various organosilane-based compounds such as hydrogen, alkyl, phenyl, epoxy, methyl and cyclohexyl; and (c) a 6-functional organosilane monomer for molecular weight control through a sol-gel reaction method as a binder resin, and mixing a photo-active compound having a naphthoquinonediazide sulfonic acid ester group-substituted structure thereto.

In addition, the present invention relates to a positive resist composition including (d) a surfactant and (e) various glycol-based solvents for adhesive strength to a substrate, a leveling property and a coating spot property of the formed pattern.

According to one embodiment of the present invention, the present invention relates to a positive resist composition including 5% by weight to 50% by weight of a polysilsesquioxane-based copolymer prepared by copolymerizing two or more types of compounds selected from the group consisting of (a) an organosilane monomer including an "alkali soluble" end; (b) a monomer including "alkali insoluble" various organosilane-based compounds such as hydrogen, alkyl, phenyl, epoxy, methyl and cyclohexyl; and (c) a 6-functional organosilane monomer for molecular weight control through a sol-gel reaction method, 2% by weight to 40% by weight of a photo-active compound having a naphthoquinonediazide sulfonic acid ester group-substituted structure, and 10% by weight to 93% by weight of an organic solvent. As necessary, a surfactant may be further added to the above-mentioned composition in 0.01% by weight to 10% by weight for a leveling property.

According to one embodiment of the present invention, the composition of the present invention uses a thin aqueous alkali solution including TMAH, KOH, $Na_2CO_3$ and the like in a 0.01% by weight to 10% by weight concentration as a developing liquid, and the organosilane-based monomer including a soluble end in the aqueous alkali solution is preferably a monomer represented by the following Chemical Formula 1:

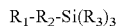  [Chemical Formula 1]

In Chemical Formula 1, $R_1$ is an alkali soluble component, and preferably includes a substituent capable of forming salts in an alkali solution, or includes a hydrophilic group. More preferably, $R_1$ is selected from the group consisting of carboxylic acid, maleic anhydride, itaconic anhydride, succinic anhydride, phthalic anhydride, salicylic acid, phenol, thiol, a hydroxyl group, a sulfonic acid group, and a tert-butyloxycarbonyl group, a tert-butoxystyrene group, a p-(1-ethoxyethoxy) styrene group and a p-acetoxystyrene group deprotected to carboxylic acid or phenol under an acidic catalyst.

In Chemical Formula 1, $R_2$ is a linear or branched alkylene group having 1 to 12 carbon atoms, an aromatic group having 6 to 18 carbon atoms or an aliphatic group having 3 to 18 carbon atoms, preferably a linear or branched alkylene group having 1 to 6 carbon atoms, or an aromatic group or an aliphatic group having 6 to 14 carbon atoms, and more preferably a linear or branched alkylene group having 1 to 4 carbon atoms, phenylene, biphenylene, cyclohexylene or bicyclohexylene, and $R_3$ is an alkoxy group having 1 to 4 carbon atoms capable of hydrolysis. Specific examples of the alkoxy group may include methoxy, ethoxy, propoxy, t-butoxy and the like, but are not limited thereto.

In the present invention, the organosilane-based monomer including various organic-based ends having alkali insoluble as a copolymerization component besides the alkali soluble component of Chemical Formula 1 is preferably a monomer represented by the following Chemical Formula 2:

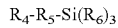  [Chemical Formula 2]

In Chemical Formula 2, $R_4$ is an alkali insoluble component, and preferably does not form salts in an alkali solution, or includes a hydrophobic substituent. More preferably, $R_4$ is selected from the group consisting of hydrogen, a linear or branched alkyl group having 1 to 5 carbon atoms, phenyl, biphenyl, cyclohexyl, bicyclohexyl, glycidyloxy, cyclohexylepoxy, oxetane, acryloxy, methacryloxy, trifluoromethyl, vinyl, an alkoxy group having 1 to 4 carbon atoms, and isocyanate.

In Chemical Formula 2, $R_5$ is a linear or branched alkylene group having 1 to 12 carbon atoms, an aromatic group having 6 to 18 carbon atoms or an aliphatic group having 3 to 18 carbon atoms, preferably a linear or branched alkylene group having 1 to 6 carbon atoms, or an aromatic group or an aliphatic group having 6 to 14 carbon atoms, and more preferably a linear or branched alkylene group having 1 to 4 carbon atoms, phenylene, biphenylene, cyclohexylene, or bicyclohexylene, and $R_6$ is an alkoxy group having 1 to 4 carbon atoms capable of hydrolysis. Specific examples of the alkoxy group may include methoxy, ethoxy, propoxy, t-butoxy and the like, but are not limited thereto.

In the present invention, the organosilane having a 6-functional symmetric structure used for molecular weight control besides the alkali soluble component of Chemical Formula 1 and the copolymerization component of Chemical Formula 2 is preferably a monomer represented by Chemical Formula 3:

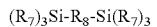  [Chemical Formula 3]

In the bis-silane structure of Chemical Formula 3, $R_7$ is an alkoxy group having 1 to 4 carbon atoms capable of hydrolysis. Specific examples of the alkoxy group may include methoxy, ethoxy, propoxy, t-butoxy and the like, but are not limited thereto.

$R_8$ is a linear or branched alkylene group having 1 to 12 carbon atoms, an aromatic group having 6 to 18 carbon atoms or an aliphatic group having 3 to 18 carbon atoms. Preferably, $R_8$ is a linear or branched alkylene group having 1 to 6 carbon atoms, or an aromatic group or an aliphatic group formed with 6 to 14 carbon atoms. More preferably, $R_8$ is selected from the group consisting of a linear or branched alkylene group having 1 to 4 carbon atoms, phenylene, biphenylene, cyclohexylene, 4,4-bicyclohexylene, vinylene and ethynylene.

According to one embodiment of the present invention, the polysilsesquioxane copolymer of the present invention is prepared by copolymerizing two or more types of compounds selected from the group consisting of Chemical Formulae 1, 2 and 3 through a sol-gel reaction, and a sequence of each polymerization unit is not limited.

In addition, according to one embodiment of the present invention, the polysilsesquioxane copolymer of the present invention is prepared by copolymerizing the compounds of Chemical Formulae 1, 2 and 3 through a sol-gel reaction, and a sequence of each polymerization unit is not limited.

Advantageous Effects

A silsesquioxane-based positive resist composition according to the present invention is capable of forming high resolution patterns of 3 um since an exposure unit thereof is readily developed in an aqueous alkali solution, and also has excellent heat resistance with a weight decrease of less than 3% at a high temperature of 300° C. and a weight decrease of less than 20% at a high temperature of 400° C. in a thermogravimetric analysis (TGA) after pattern formation.

In addition, a pattern taper angle can be controlled by modifying a molecular weight of the silsesquioxane-based copolymer, and accordingly, various process conditions can be embraced. Particularly, patterns formed in a smooth low taper angle of less than 30° is advantageous for uniform follow-up depositions of ITO, IZO, SiNx and various metal electrode membranes.

Furthermore, when forming an insulating layer or a bank with the silsesquioxane-based positive resist composition of the present invention instead of an existing acryl- (k=3.6) or imide-based insulating layer (k=3.5), signal interference between wires may decrease due to a low dielectric (k=3.3) property, and an insulating property can be obtained at a relatively small thickness, which are advantageous for device design and productivity enhancement.

MODE FOR DISCLOSURE

Figure 1:
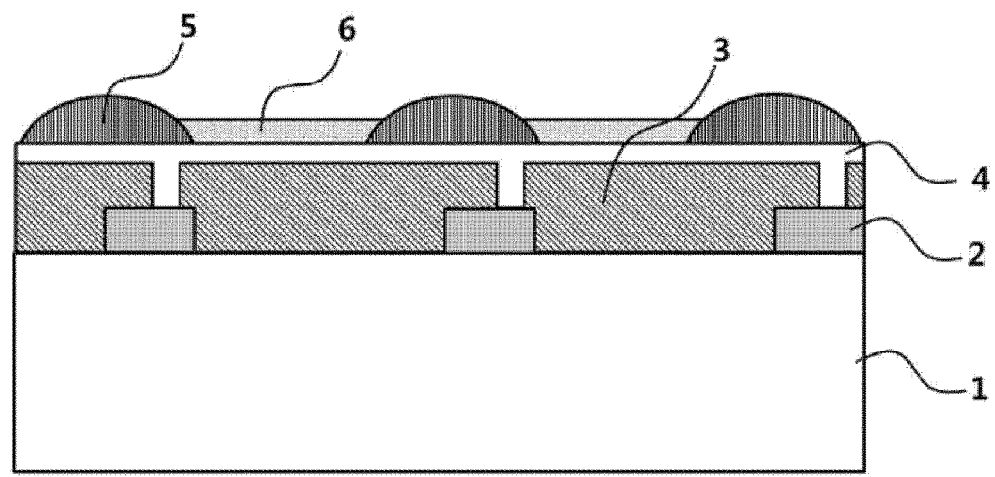
FIG. 1 is a schematic sectional diagram of a common organic EL display device.
Figure 2:
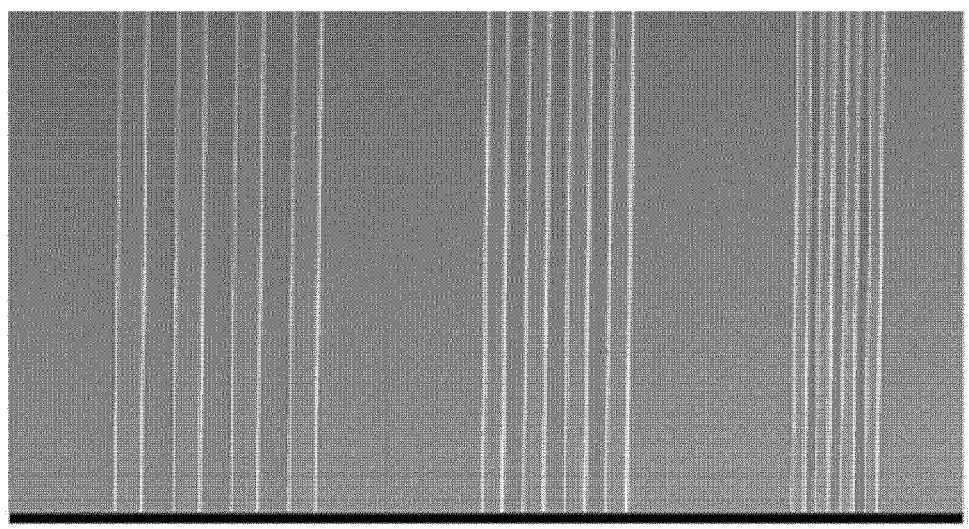
FIG. 2 is a scanning electron microscopy picture (right: 3 um line width, center: 5 um line width, left: 7 um line width) of a resist film formed with a composition of the present invention.
Figure 3:
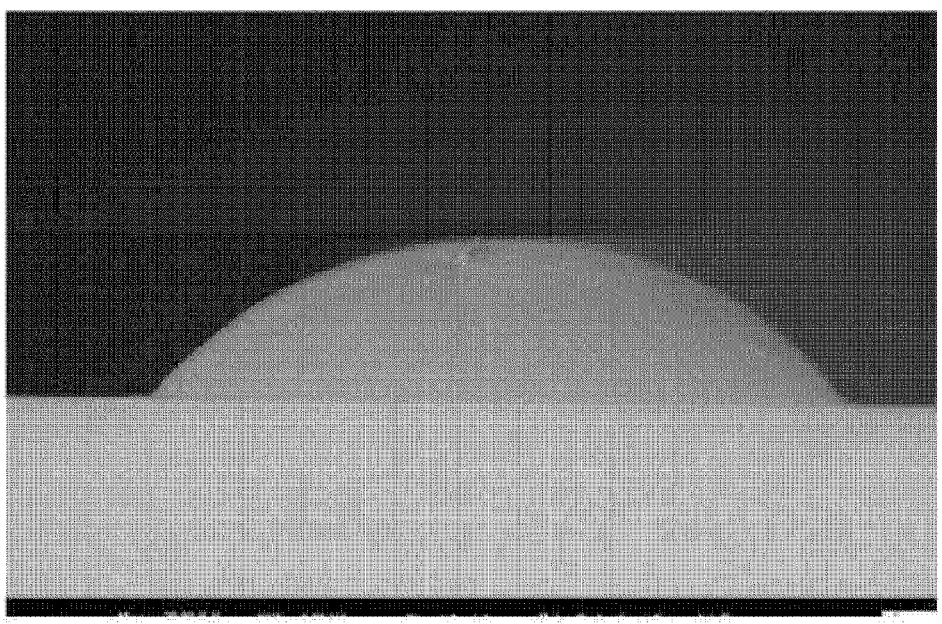
FIG. 3 is a scanning electron microscopy picture (picture of 10 μm pattern section) using a composition of the present invention as a resist for a bank of an organic EL display device.

Terms used in the present specification and the claims should not be construed as being limited to common or dictionary definitions.

According to one preferred embodiment of the present invention, the present invention relates to a positive resist composition including 5% by weight to 50% by weight of a polysilsesquioxane copolymer prepared by copolymerizing two or more types of compounds selected from the group consisting of Chemical Formula 1, Chemical Formula 2 and Chemical Formula 3 through a sol-gel reaction; 2% by weight to 40% by weight of a photo-active compound having a naphthoquinonediazide sulfonic acid ester group-substituted structure; and 10% by weight to 93% by weight of an organic solvent, wherein 0.01% by weight to 10% by weight of a surfactant is added thereto.

In addition, according to preferred one embodiment of the present invention, the present invention relates to a positive resist composition including 5% by weight to 50% by weight of a polysilsesquioxane copolymer prepared by copolymerizing various functional organosilane-based monomers described in Chemical Formula 1, Chemical Formula 2 and Chemical Formula 3 through a sol-gel reaction; 2% by weight to 40% by weight of a photo-active compound having a naphthoquinonediazide sulfonic acid ester group-substituted structure; and 10% by weight to 93% by weight of an organic solvent, wherein 0.01% by weight to 10% by weight of a surfactant is additionally added thereto.

A main chain structure itself of a silsesquioxane-based copolymer included in the positive resist composition of the present invention is a Si—$O_x$ bond, and organic substituents produce a curing reaction in a hard bake process. Accordingly, excellent heat resistance, low out-gas, low moisture absorption and chemical resistance may be provided to a resist film formed by curing the positive resist composition of the present invention.

The organosilane-based monomer including a soluble end in an aqueous alkali solution is preferably a monomer represented by the following Chemical Formula 1:

$R_1$-$R_2$-Si($R_3$)$_3$  [Chemical Formula 1]

In Chemical Formula 1, $R_1$ is an alkali soluble component, and preferably includes a substituent capable of forming salts in an alkali solution, or includes a hydrophilic group. More preferably, $R_1$ is selected from the group consisting of carboxylic acid, maleic anhydride, itaconic anhydride, succinic anhydride, phthalic anhydride, salicylic acid, phenol, thiol, a hydroxyl group, a sulfonic acid group, and a tert-butyloxycarbonyl group, a tert-butoxystyrene group, a p-(1-ethoxyethoxy) styrene group and a p-acetoxystyrene group deprotected to carboxylic acid or phenol under an acidic catalyst.

In Chemical Formula 1, $R_2$ is a linear or branched alkylene group having 1 to 12 carbon atoms, an aromatic group having 6 to 18 carbon atoms or an aliphatic group having 3 to 18 carbon atoms, preferably a linear or branched alkylene group having 1 to 6 carbon atoms, or an aromatic group or an aliphatic group having 6 to 14 carbon atoms, and more preferably a linear or branched alkylene group having 1 to 4 carbon atoms, phenylene, biphenylene, cyclohexylene or bicyclohexylene, and $R_3$ is an alkoxy group having 1 to 4 carbon atoms capable of hydrolysis. Specific examples of the alkoxy group may include methoxy, ethoxy, propoxy, t-butoxy and the like, but are not limited thereto.

In the present invention, the organosilane-based monomer including various organic-based ends having alkali insoluble as a copolymerization component besides the alkali soluble component of Chemical Formula 1 is preferably a monomer represented by the following Chemical Formula 2:

$R_4$-$R_5$-Si($R_6$)$_3$  [Chemical Formula 2]

In Chemical Formula 2, $R_4$ is an alkali insoluble component, and preferably does not form salts in an alkali solution, or includes a hydrophobic substituent. More preferably, $R_4$ is selected from the group consisting of hydrogen, a linear or branched alkyl group having 1 to 5 carbon atoms, phenyl, biphenyl, cyclohexyl, bicyclohexyl, glycidyloxy, cyclohexylepoxy, oxetane, acryloxy, methacryloxy, trifluoromethyl, vinyl, an alkoxy group having 1 to 4 carbon atoms, and isocyanate.

In Chemical Formula 2, $R_5$ is a linear or branched alkylene group having 1 to 12 carbon atoms, an aromatic group having 6 to 18 carbon atoms or an aliphatic group having 3 to 18 carbon atoms, preferably a linear or branched alkylene group having 1 to 6 carbon atoms, or an aromatic group or an aliphatic group having 6 to 14 carbon atoms, and more preferably a linear or branched alkylene group having 1 to 4 carbon atoms, phenylene, biphenylene, cyclohexylene, or bicyclohexylene, and $R_6$ is an alkoxy group having 1 to 4 carbon atoms capable of hydrolysis. Specific examples of the alkoxy group may include methoxy, ethoxy, propoxy, t-butoxy and the like, but are not limited thereto.

In the present invention, the organosilane having a 6-functional symmetric structure used for molecular weight control besides the alkali soluble component of Chemical Formula 1 and the copolymerization component of Chemical Formula 2 is preferably a monomer represented by Chemical Formula 3:

$(R_7)_3$Si-$R_8$-Si$(R_7)_3$  [Chemical Formula 3]

In the bis-silane structure of Chemical Formula 3, $R_7$ is an alkoxy group having 1 to 4 carbon atoms capable of hydrolysis. Specific examples of the alkoxy group may include methoxy, ethoxy, propoxy, t-butoxy and the like, but are not limited thereto.

$R_8$ is a linear or branched alkylene group having 1 to 12 carbon atoms, an aromatic group having 6 to 18 carbon atoms or an aliphatic group having 3 to 18 carbon atoms. Preferably, $R_8$ is a linear or branched alkylene group having 1 to 6 carbon atoms, or an aromatic group or an aliphatic group formed with 6 to 14 carbon atoms. More preferably, $R_8$ is selected from the group consisting of a linear or branched alkylene group having 1 to 4 carbon atoms, phenylene, biphenylene, cyclohexylene, 4,4-bicyclohexylene, vinylene and ethynylene.

According to one embodiment of the present invention, the polysilsesquioxane copolymer of the present invention is prepared by copolymerizing two or more types of compounds selected from the group consisting of Chemical Formulae 1, 2 and 3 through a sol-gel reaction, and a sequence of each polymerization unit is not limited.

In addition, according to one embodiment of the present invention, the polysilsesquioxane copolymer of the present invention is prepared by copolymerizing the compounds of Chemical Formulae 1, 2 and 3 through a sol-gel reaction, and a sequence of each polymerization unit is not limited.

In one embodiment of the present invention, the composition of the present invention may be a random copolymer prepared from the following Experimental Example 1, but is not limited thereto.

[Experimental Example 1]

weight (Mw) of 300 to 100,000, a degree of dispersion of 1.0 to 10.0, and an acid value of 10 KOH mg/g to 400 KOH mg/g. The silsesquioxane-based copolymer more preferably has a weight average molecular weight (Mw) of 1,000 to 30,000, a degree of dispersion of 1.3 to 3.0 and an acid value of 20 KOH mg/g to 200 KOH mg/g.

In addition, the silsesquioxane-based positive resist composition of the present invention may include a photo-active compound responding to light The photo-active compound used in the composition of the present invention may include photo-active compounds commonly used in positive resists, and examples thereof may include photo-active compounds in which naphthoquinone-1,2-diazide-4-sulfonic acid ester or naphthoquinone-1,2-diazide-5-sulfonic acid ester group substitutes in Ballast such as 9,9-bis(4-hydroxyphenyl)fluorene, bisphenol-A, 4,4'-[1-[4-[1-(4-hydroxyphenyl)-1-methylethyl]phenyl]-ethylidene]bisphenol, 2,3,4-trihydroxybenzophenone, 2,3,4-trihydroxyacetophenone, 2,3,4-trihydroxyphenylhexyl ketone, 2,4,4'-

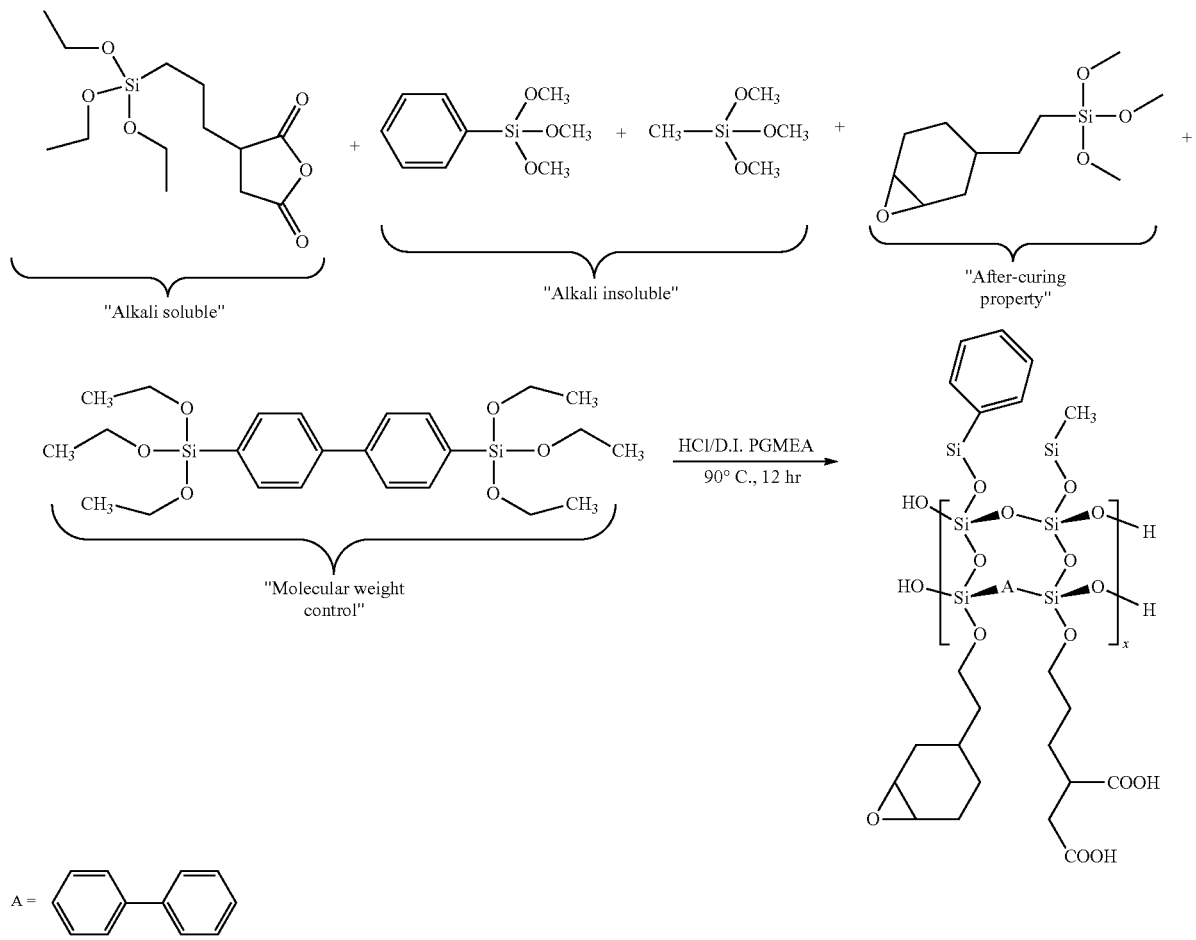

The silsesquioxane-based copolymer according to the present invention is preferably included in 5% by weight to 50% by weight with respect to the total weight of the composition. When the content is less than 5% by weight, a thin film form may not be obtained from spin coating, and when the content is greater than 50% by weight, sufficient photosensitivity may not be obtained.

For excellent photosensitivity, the silsesquioxane-based copolymer preferably has a weight average molecular trihydroxybenzophenone, 2,4,6-trihydroxybenzophenone, 2,3,4-trihydroxy-2'-methylbenzophenone, 2,2',4,4'-tetrahydroxybenzophenone, 2,3,4,4'-tetrahydroxybenzophenone, 4,4',4''-trihydroxyphenylmethane, 4,4',4''-ethylidenetris(2-methylphenol), bis(4-hydroxyphenl)methylphenylmethane, 1,1,4-tris(4-hydroxyphenyl)cyclohexane, 2,2',3,4,4'-pentahydroxybenzophenone, 2,2',3,4,4',5-hexahydroxybenzophenone, 2,2',3,4,4'-pentahydroxydiphenylpropane and 2,2',3,4,4',5-pentahydroxydiphenylpropane.

Such a photo-active compound is preferably used in 2% by weight to 40% by weight with respect to the total weight of the composition for optimizing a development property for an alkali solution of the photoresist. When the content is less than 2% by weight, patterns may not be obtained due to insignificant photosensitivity effects, and when the content is greater than 40% by weight, sensitivity becomes excessively slowed together with a phenomenon of phase separation.

In the silsesquioxane-based positive resist composition of the present invention, a solvent is added to adjust viscosity to a proper level, and the viscosity range is preferably from 2 cP to 200 cP. Such a solvent is used not only for mixing and uniformly dissolving the silsesquioxane-based copolymer resin, the photo-active compound and the surfactant, but for obtaining excellent coatability, and proper solvents used in the art may be selected considering compatibility with the above-mentioned constituents.

Specific examples of the used solvent may include one or more types of solvents selected from the group consisting of ethyl acetate, butyl acetate, diethylene glycol dimethyl ethyl ether, methyl methoxy propionate, ethyl ethoxy propionate, ethyl lactate, propylene glycol methyl ether acetate, propylene glycol methyl ether, propylene glycol propyl ether, methyl cellosolve acetate, ethyl cellosolve acetate, diethylene glycol methyl acetate, diethylene glycol ethyl acetate, acetone, methyl isobutyl ketone, cyclohexanone, N-methyl-2-pyrrolidone (NMP), ethylene glycol dimethyl ether, tetrahydrofuran, methyl cellosolve, ethyl cellosolve, diethylene glycol methyl ether, diethylene glycol ethyl ether, dipropylene glycol methyl ether, toluene and xylene, but are not limited thereto.

Hereinafter, the present invention will be described in detail with reference to examples. However, examples according to the present invention may be modified to various other forms, and the scope of the present invention should not be construed as being limited to the examples described below. Examples of the present invention are provided in order to more completely describe the present invention for those having average knowledge in the art.

<Synthesis Example 1> Synthesis of Polysilsesquioxane Copolymer (1)

After 3-(triethoxysilyl)propyl succinic anhydride (90.39 g, 0.30 mol), phenyltrimethoxysilane (58.88 g, 0.30 mol), [2-(3,4-epoxycyclohexyl)ethyl]trimethoxysilane (87.69 g, 0.36 mol), methyltrimethoxysilane (16.18 g, 0.12 mol), 4,4'-bis(triethoxysilyl)-1,1'-biphenyl (56.86 g, 0.12 mol) and propylene glycol monomethyl ether acetate (200 g) were each weighed and mixed in a 2-L flask equipped with a funnel, a cooling tube and a stirrer, a mixed liquid of an aqueous 35% HCl solution (11.9 g, 0.1 mol) and ultrapure water (80 g) was slowly added dropwise thereto while stirring the solution. Herein, the temperature was maintained so that the heating temperature did not exceed 50° C. After the dropwise addition, the reaction temperature was raised to 90° C., and the result was stirred for 12 hours. After the reaction was complete, distilled water was added thereto to collect an organic phase through phase separation, and residual solvent and moisture were evaporated and removed to obtain 150 g of a polysilsesquioxane copolymer resin. The obtained copolymer resin was dissolved in 450 g of propylene glycol monomethyl ether acetate. Based on the GPC measurement result, the weight average molecular weight of the copolymer resin was 5,000.

<Synthesis Example 2> Synthesis of Polysilsesquioxane Copolymer (2)

After 3-(triethoxysilyl)propyl succinic anhydride (91.22 g, 0.30 mol), phenyltrimethoxysilane (59.42 g, 0.30 mol), [2-(3,4-epoxycyclohexyl)ethyl]trimethoxysilane (88.49 g, 0.36 mol), methyltrimethoxysilane (29.33 g, 0.22 mol), 4,4'-bis(triethoxysilyl)-1,1'-biphenyl (11.48 g, 0.02 mol) and propylene glycol monomethyl ether acetate (200 g) were each weighed in a 2-L flask equipped with a funnel, a cooling tube and a stirrer, a mixed liquid of an aqueous 35% HCl solution (11.9 g, 0.1 mol) and ultrapure water (80 g) was slowly added dropwise thereto while stirring the solution. Herein, the temperature was maintained so that the heating temperature did not exceed 50° C. After the dropwise addition, the reaction temperature was raised to 90° C., and the result was stirred for 12 hours. After the reaction was complete, distilled water was added thereto to collect an organic phase through phase separation, and residual solvent and moisture were evaporated and removed to obtain 150 g of a polysilsesquioxane copolymer resin. The obtained copolymer resin was dissolved in 450 g of propylene glycol monomethyl ether acetate. Based on the GPC measurement result, the weight average molecular weight of the copolymer resin was 2,000.

<Synthesis Example 3> Synthesis of Polysilsesquioxane Copolymer (3)

After 3-(triethoxysilyl)propyl succinic anhydride (92.36 g, 0.30 mol), phenyltrimethoxysilane (60.16 g, 0.30 mol), [2-(3,4-epoxycyclohexyl)ethyl]trimethoxysilane (89.60 g, 0.36 mol), methyltrimethoxysilane (3.31 g, 0.02 mol), 4,4'-bis(triethoxysilyl)-1,1'-biphenyl (104.58 g, 0.22 mol) and propylene glycol monomethyl ether acetate (200 g) were each weighed in a 2-L flask equipped with a funnel, a cooling tube and a stirrer, a mixed liquid of an aqueous 35% HCl solution (11.9 g, 0.1 mol) and ultrapure water (80 g) was slowly added dropwise thereto while stirring the solution. Herein, the temperature was maintained so that the heating temperature did not exceed 50° C. After the dropwise addition, the reaction temperature was raised to 90° C., and the result was stirred for 12 hours. After the reaction was complete, distilled water was added thereto to collect an organic phase through phase separation, and residual solvent and moisture were evaporated and removed to obtain 150 g of a polysilsesquioxane copolymer resin. The obtained copolymer resin was dissolved in 450 g of propylene glycol monomethyl ether acetate. Based on the GPC measurement result, the weight average molecular weight of the copolymer resin was 20,000.

<Example 1> Preparation of Polysilsesquioxane-based Positive Resist (1)

After blocking ultraviolet rays, 100 parts by weight of the polysilsesquioxane resin solution prepared in Synthesis Example 1 in a solid ratio, 25 parts by weight of a 2,3,4,4'-tetrahydroxyphenone 1,2-naphthoquinonediazide-5-sulfonate photo-active compound (PAC) and 0.5 parts by weight of a silicone-based surfactant were diluted and dissolved using propylene glycol monomethyl ether acetate as a dilution solvent so that the solid content of the composition became 30% by weight, and the result was filtered using a PTFE membrane filter having a pore size of 0.1 um to obtain a liquid resist composition.

<Example 2> Preparation of Polysilsesquioxane-based Positive Resist (2)

After blocking ultraviolet rays, 100 parts by weight of the polysilsesquioxane resin solution prepared in Synthesis Example 2 in a solid ratio, 25 parts by weight of a 2,3,4,4'-tetrahydroxyphenone 1,2-naphthoquinonediazide-5-sulfonate photo-active compound (PAC) and 0.5 parts by weight of a silicone-based surfactant were diluted and dissolved using propylene glycol monomethyl ether acetate as a dilution solvent so that the solid content of the composition became 30% by weight, and the result was filtered using a PTFE membrane filter having a pore size of 0.1 um to obtain a liquid resist composition.

<Example 3> Preparation of Polysilsesquioxane-based Positive Resist (3)

After blocking ultraviolet rays, 100 parts by weight of the polysilsesquioxane resin solution prepared in Synthesis Example 3 in a solid ratio, 25 parts by weight of a 2,3,4, 4'-tetrahydroxyphenone 1,2-naphthoquinonediazide-5-sulfonate photo-active compound (PAC) and 0.5 parts by weight of a silicone-based surfactant were diluted and dissolved using propylene glycol monomethyl ether acetate as a dilution solvent so that the solid content of the composition became 30% by weight, and the result was filtered using a PTFE membrane filter having a pore size of 0.1 um to obtain a liquid resist composition.

<Comparative Example 1>

After blocking ultraviolet rays, 100 parts by weight of a xiameter RSN-0217 phenyl siloxane resin manufactured by Dow Corning Corporation in a solid ratio instead of the synthesized resin of the present invention, 25 parts by weight of a 2,3,4,4'-tetrahydroxyphenone 1,2-naphthoquinonediazide-5-sulfonate photo-active compound (PAC) and 0.5 parts by weight of a silicone-based surfactant were diluted and dissolved using propylene glycol monomethyl ether acetate as a dilution solvent so that the solid content of the composition became 30% by weight, and the result was filtered using a PTFE membrane filter having a pore size of 0.1 um to obtain a liquid resist composition.

<Comparative Example 2>

100 parts by weight of the following poly(tert-butyl acrylate-co-ethyl acrylate-co-methacrylic acid), (methacrylic acid 23, acid value 140 mg KOH/g to 160 mg KOH/g) acrylic copolymer manufactured by Sigma-Aldrich CO. LLC. in a solid ratio instead of the synthesized resin of the present invention, 25 parts by weight of a 2,3,4,4'-tetrahydroxyphenone 1,2-naphthoquinonediazide-5-sulfonate photo-active compound (PAC) and 0.5 parts by weight of a silicone-based surfactant were diluted and dissolved using propylene glycol monomethyl ether acetate as a dilution solvent so that the solid content of the composition became 30% by weight, and the result was filtered using a PTFE membrane filter having a pore size of 0.1 um to obtain a liquid resist composition.

On the resist compositions of the examples and the comparative examples, physical property evaluations were carried out, and the evaluation results are shown in the following Table 1.

<1. Formation of Coated Film>

The resist composition was spin coated on a silicon wafer or glass substrate at a rate of 1,000 rpm to form a film, and the result was baked for 120 seconds in a hot plate at 100° C. using a soft bake process, and a thickness of the coated film was measured using an optical thickness measuring device (Product name: ST-4000 manufactured by K-MAC).

<2. Evaluation on Pattern>

After irradiating energy of 100 mJ/cm$^2$ (based on I-line, 365 nm) using a photomask having a 3 um to 300 um line and space 1:1 space and a mask aligner equipped with G, H and I-line ultraviolet lamps (product name: SUSS MA-6), the result was developed in a 2.38% TMAH thin aqueous alkali solution for 60 seconds, and flushed with ultrapure water. The patterned substrate obtained as above was heated for 30 minutes in an oven at 230° C. The pattern-formed silicon wafer or glass substrate was observed with an electron microscope, and forming a 3 um pattern without scum was determined as "excellent", and a sample that did not form a 3 um pattern or had severe scum was determined as "poor".

<3. Evaluation on Film Retention Ratio>

A film retention ratio was calculated through the following Equation 1.

$$\text{film retention ratio (\%)} = (\text{film thickness after development and curing processes/initial thickness}) \times 100 \qquad \text{Equation 1}$$

<4. Evaluation on Heat Resistance>

Thermogravimetric analysis (device name TGA manufactured by PerkinElmer Inc.) was carried out on the sample gone through the curing, and a weight decrease rate (loss wt %) by temperature was measured while raising the temperature from room temperature to 600° C. at a rate of 10° C./min. Herein, a weight decrease rate of 20% or less at a 400° C. point was determined as "excellent", a weight decrease rate between 20% and 40% was determined as "normal", and a weight decrease rate of 40% or greater was determined as "poor".

<5. Evaluation on Chemical Resistance>

After going through the coated film formation and the curing, a film thickness swelling variation rate was calculated after immersing the result in a PR stripping liquid (product name, LT-360) for 10 minutes at 40° C. Swelling of less than 5% was determined as "excellent", and swelling of 5% or greater was determined as "poor".

<6. Evaluation on Dielectric Constant>

After going through the thin film formation on an ITO substrate and the curing, a metal-insulator-metal (MIM) evaluation cell was prepared by depositing an aluminum electrode having a diameter of 1.0. With the evaluation cell, capacity (C) of the coated resist film was measured using an LCR-meter (4284 manufactured by Agilent Technologies) for measuring a dielectric constant, and the dielectric constant was obtained through the following Equation 2. In the following Equation 2, d=thickness of resist film, A=area of deposited electrode, $\varepsilon_0$ is a dielectric constant under vacuum (8.855×10−12 F/m), and $\varepsilon$ is a dielectric constant of the resist film to calculate.

$$C = (\varepsilon_0 \varepsilon A)/d \qquad \text{Equation 2}$$

<7. Evaluation on Moisture Absorption Rate>

After going through the coating film formation and the curing, a film thickness swelling variation rate was calculated after immersing the result in distilled water for 72 hours at room temperature. Swelling of less than 2% was determined as "excellent", and swelling of 2% or greater was determined as "poor".

TABLE 1

| Category | Pattern | Film Retention Ratio (%) | Heat Resistance (Loss wt %) | Chemical Resistance | Dielectric Constant | Moisture Absorption Rate (%) |
|---|---|---|---|---|---|---|
| Example 1 | Excellent | 89 | Excellent | Excellent | 3.31 | Excellent |
| Example 2 | Excellent | 87 | Excellent | Excellent | 3.31 | Excellent |
| Example 3 | Excellent | 92 | Excellent | Excellent | 3.30 | Excellent |
| Comparative Example 1 | Poor | 79 | Poor | Poor | 3.56 | Poor |
| Comparative Example 2 | Poor | 78 | Poor | Poor | 3.63 | Poor |

As can be seen from Table 1, the positive resist composition using silsesquioxane, a copolymer mixing two or more types selected from the group consisting of Chemical Formulae 1, 2 and 3 in the present invention, not only exhibited excellent heat resistance capable of withstanding a high temperature process, but also had a high film retention ratio obtained therefrom, and excellent chemical resistance and pattern resolution unlike existing photoresist compositions. In addition, the resist film formed with the composition of the present invention exhibited a low dielectric property and had a low moisture absorption rate compared to the resist films of the comparative examples, and reliability of a device is expected to be excellent thereby. Accordingly, it can be seen that the resist film obtained from the composition of the present invention may be useful as an interlayer insulating layer of a liquid crystal display device or a resist for a bank of an organic EL display device.

REFERENCE NUMERAL

1: Glass Substrate;
2: TFT Device;
3: Via Hole Insulating Layer,
4: ITO Electrode;
5: Bank Insulating Layer,
6: OLED Light Emitting Body Deposition Layer A silsesquioxane-based positive resist composition according to the present invention is capable of forming high resolution patterns of 3 um since an exposure unit thereof is readily developed in an aqueous alkali solution, and also has excellent heat resistance with a weight decrease of less than 3% at a high temperature of 300° C. and a weight decrease of less than 20% at a high temperature of 400° C. in a thermogravimetric analysis (TGA) after pattern formation.

In addition, a pattern taper angle can be controlled by modifying a molecular weight of the silsesquioxane-based copolymer, and accordingly, various process conditions can be embraced. Particularly, patterns formed in a smooth low taper angle of less than 30° are advantageous for follow-up depositions of uniform ITO, IZO, SiNx and various metal electrode membranes.

Furthermore, when forming an insulating layer or a bank with the silsesquioxane-based positive resist composition of the present invention instead of an existing acryl- (k=3.6) or imide-based insulating layer (k=3.5), signal interference between wires may decrease due to a low dielectric (k=3.3) property, and an insulating property can be obtained at a relatively small thickness, which are advantageous for device design and productivity enhancement

The invention claimed is:

1. A positive photoresist composition comprising:
a polysilsesquioxane-based copolymer in 5% by weight to 50% by weight;
a naphthoquinone-1,2-diazide-4-sulfonic acid ester or naphthoquinone-1,2-diazide-5-sulfonic acid ester group-substituted photo-active compound in 2% by weight to 40% by weight; and
an organic solvent in 10% by weight to 93% by weight,
wherein the polysilsesquioxane-based copolymer copolymerized by mixing Chemical Formula 1, Chemical Formula 2 and Chemical Formula 3:

  [Chemical Formula 1]

  [Chemical Formula 2]

  [Chemical Formula 3]

wherein,
$R_1$ is selected from the group consisting of maleic anhydride, itaconic anhydride, succinic anhydride, and phthalic anhydride;
$R_2$, $R_5$ and $R_8$ are each independently a linear or branched alkylene group having 1 to 12 carbon atoms, an aromatic group having 6 to 18 carbon atoms or an aliphatic group having 3 to 18 carbon atoms;
$R_3$, $R_6$ and $R_7$ are each independently an alkoxy group having 1 to 4 carbon atoms; and
$R_4$ is selected from the group consisting of hydrogen, a linear or branched alkyl group having 1 to 5 carbon atoms, phenyl, biphenyl, cyclohexyl, bicyclohexyl, glycidyloxy, cyclohexylepoxy, oxetane, acryloxy, methacryloxy, trifluoromethyl, vinyl, an alkoxy group having 1 to 4 carbon atoms, and isocyanate.

2. The positive photoresist composition of claim 1, wherein $R_2$, $R_5$ and $R_8$ are each independently a linear or branched alkylene group having 1 to 6 carbon atoms, or an aromatic group or an aliphatic group having 6 to 14 carbon atoms.

3. The positive photoresist composition of claim 2, wherein $R_2$, $R_5$ and $R_8$ are each independently a linear or branched alkylene group having 1 to 4 carbon atoms, phenylene, biphenylene, cyclohexylene or bicyclohexylene.

4. The positive photoresist composition of claim 1, wherein the silsesquioxane-based copolymer has a weight average molecular weight (Mw) of 300 to 100,000, a degree of dispersion of 1.0 to 10.0 and an acid value of 10 KOH mg/g to 400 KOH mg/g.

5. The positive photoresist composition of claim 1, wherein the photo-active compound is a photo-active compound in which naphthoquinone-1,2-diazide-4-sulfonic acid ester or naphthoquinone-1,2-diazide-5-sulfonic acid ester group substitutes in Ballast selected from the group consisting of 9,9-bis(4-hydroxyphenyl)fluorene, bisphenol-A, 4,4'-[1-[4-[1-(4-hydroxyphenyl)-1-methylethyl]phenyl]-ethylidene]bisphenol, 2,3,4-trihydroxybenzophenone, 2,3,4-trihydroxyacetophenone, 2,3,4-trihydroxyphenylhexyl ketone, 2,4,4'-trihydroxybenzophenone, 2,4,6-trihydroxybenzophenone, 2,3,4-trihydroxy-2'-methylbenzophenone, 2,2',4,4'-tetrahydroxybenzophenone, 2,3,4,4'-tetrahydroxybenzophenone, 4,4',4"-trihydroxyphenylmethane, 4,4',4"-ethylidenetris(2-methylphenol), bis(4-hydroxyphenyl)methylphenylmethane, 1,1,4-tris(4-hydroxyphenyl)cyclohexane, 2,2',3,4,4'-pentahydroxybenzophenone, 2,2',3,4,4',5-hexahydroxybenzophenone, 2,2',3,4,4'-pentahydroxydiphenylpropane and 2,2',3,4,4',5-pentahydroxydiphenylpropane.

6. The positive photoresist composition of claim 1, wherein the organic solvent is one or more types of solvents selected from the group consisting of ethyl acetate, butyl acetate, diethylene glycol dimethyl ethyl ether, methyl methoxy propionate, ethyl ethoxy propionate, ethyl lactate, propylene glycol methyl ether acetate, propylene glycol methyl ether, propylene glycol propyl ether, methyl cellosolve acetate, ethyl cellosolve acetate, diethylene glycol methyl acetate, diethylene glycol ethyl acetate, acetone, methyl isobutyl ketone, cyclohexanone, N-methyl-2-pyrrolidone (NMP), ethylene glycol dimethyl ether, tetrahydrofuran, methyl cellosolve, ethyl cellosolve, diethylene glycol methyl ether, diethylene glycol ethyl ether, dipropylene glycol methyl ether, toluene and xylene.

* * * * *